United States Patent [19]
Vaughn

[11] Patent Number: 6,016,052
[45] Date of Patent: Jan. 18, 2000

[54] PULSE FREQUENCY MODULATION DRIVE CIRCUIT FOR PIEZOELECTRIC TRANSFORMER

[75] Inventor: Gary Vaughn, Albuquerque, N.Mex.

[73] Assignee: CTS Corporation, Elkhart, Ind.

[21] Appl. No.: 09/054,634

[22] Filed: Apr. 3, 1998

[51] Int. Cl.$^7$ ............................. H01F 17/00; H01L 41/08
[52] U.S. Cl. ........................ 323/355; 310/316; 310/318
[58] Field of Search ......................... 363/17, 98; 310/316

[56] References Cited

U.S. PATENT DOCUMENTS

| | | |
|---|---|---|
| 3,919,656 | 11/1975 | Sokal et al. . |
| 5,208,205 | 5/1993 | Mitsuyasu ............................... 310/316 |
| 5,329,200 | 7/1994 | Zaitsu . |
| 5,341,061 | 8/1994 | Zaitsu . |
| 5,424,935 | 6/1995 | Wu . |
| 5,548,189 | 8/1996 | Williams . |
| 5,654,605 | 8/1997 | Kawashima . |
| 5,675,484 | 10/1997 | Shimada . |
| 5,705,877 | 1/1998 | Shimada ................................ 310/318 |
| 5,739,621 | 4/1998 | Atsuta et al. ........................... 310/316 |
| 5,760,619 | 6/1998 | Yamaguchi ............................. 327/310 |
| 5,777,425 | 7/1998 | Ino et al. ................................ 310/316 |
| 5,859,489 | 1/1999 | Shimada ................................ 310/318 |

OTHER PUBLICATIONS

Third Order Logitudinal Mode Piezoelectric Ceramic Transformer and Its Application to High–Voltage Power Inverter. Kawashima et al. IEEE 1994 Ultrasonics Symposium. p. 525–530.

Operation Analysis of the Push–Pull Piezoelectric Inverter. Shoyama et al. IEEE 1997. p. 573–578.

*Primary Examiner*—Peter S. Wong
*Assistant Examiner*—Rajnikani B. Patel
*Attorney, Agent, or Firm*—Jones, Day, Reavis & Pogue

[57] ABSTRACT

A pulse frequency modulation drive circuit (1114) for a piezoelectric transformer (1102) is provided. Circuit (1114) includes a piezoelectric transformer (1102) having a resonant frequency and an input and an output section. A frequency feedback network connected to the piezoelectric transformer (1102) and an output level sense (1112) connected to the piezoelectric transformer (1102) is also provided. A drive circuit (1114) has a first switch ($S_1$) and a third switch ($S_3$) having a capacitance (1118) therebetween. A second switch ($S_2$) and a fourth switch ($S_4$) connect a supply voltage ($V_{IN}$) to each of a pair of inductors ($L_1$ and $L_2$) and the second switch ($S_2$) and the fourth switch ($S_4$) are driven 180° out of phase at the resonant frequency of the piezoelectric transformer (1102).

30 Claims, 17 Drawing Sheets

PULSE FREQUENCY MODULATION DRIVE CIRCUIT FOR PIEZOELECTRIC TRANSFORMER

OTHER PUBLICATIONS

1. Resonant Power Converters, Kazimierczuk & Czarkowski, Wiley-Interscience, 1995.
2. Operation of the Push-Pull Piezoelectric Inverter, Shopyama et al., IEEE publication, 1997.
3. Third Order Longitudinal Mode Piezoelectric Ceramic Transformer and its Application to High-Voltage Power Inverter, Kawashima et al., IEEE Ultrasonics Symposium, November 1994.

1. Field of the Invention

This invention relates generally to the field of electrical power circuits for transformers, and in particular, to a pulse frequency modulation drive circuit for a piezoelectric transformer.

2. Background of the Invention

Generally, piezoelectric transformers have been proposed for use in power supplies for televisions, photocopiers, LCD backlights, and the like. Prior art piezoelectric transformers are based on the well known Rosen design (see U.S. Pat. No. 2,830,274). These prior art high voltage transformer designs are of a piezoelectric ceramic plate which includes a driving section and a driven section which each have different polarization. The different polarization provide for voltage transformation.

Piezoelectric transformers are inherently high Q resonators which must be driven at a particular resonant frequency to allow maximum energy transfer to occur for a given output load. There are drawbacks to this, in that, the resonant frequency point of the piezoelectric transformer is dependent on external variables including time, temperature, output load, and other variables. These variables cause the optimum power output of the transformer to degrade as frequency shifts unless the driving frequency can be continually corrected. If a driving circuit is unable to track the resonant frequency, the piezoelectric transformer will not be operated most effectively.

In many piezo-transformer based applications, the output load voltage or current must be adjustable. Ideally, it is most desirable to operate the piezo-transformer at or near its resonant frequency under all load conditions, while simultaneously providing a means to adjust or regulate the output voltage or current. Of course, high efficiency, simplicity of circuit design, and cost effectiveness are also desired.

A wide variety of drive circuits have been described in the prior art. Many are similar to drive circuits used in resonant power converters based on magnetic transformers. These prior art approaches may be categorized by the methods which they employ for resonant frequency control, drive circuit configuration, or output level regulation.

One common prior art approach to frequency control is to use an independent fixed frequency oscillator to drive the piezoelectric transformer. Since the piezoelectric transformer is a high Q device, the fixed oscillator must be carefully tuned to match the resonant frequency of the transformer. Changes in the resonant frequency due to aging, temperature, load variation, and other factors are not easily compensated for using this method.

A classic variation of the fixed frequency method involves broadening the inherently narrow bandwidth of a high Q piezoelectric transformer by using an input compensating network consisting of one or more inductors and capacitors. One advantage to this method is that a wider operating bandwidth is gained, however, this approach reduces efficiency and adds relatively large and expensive reactive components.

Another prior art approach controls the drive frequency by using a self-oscillating design in which the piezoelectric transformer becomes part of the feedback loop in a classic oscillator circuit. With appropriate feedback connections, the self-oscillating piezoelectric transformer circuit can track resonant frequency changes automatically. This method does, however, have some practical disadvantages in operation.

A piezoelectric transformer is a mechanically resonant device. The resonant modes of the transformer are determined mainly by the physical dimensions of the transformer device. A typical piezoelectric transformer may have multiple resonant modes both above and below the target resonant frequency, including both harmonic and non-harmonic ratios of the target resonant frequency. Several of these modes may have resonant gains which exceed the resonant gain at the target resonant frequency. Oftentimes, it is impractical or impossible to adequately filter or suppress these modes sufficiently to assure that the self-oscillating circuit will always start and maintain its operation at the target resonant frequency.

Yet another popular prior art approach, used with low-Q magnetic based resonant converters, involves a voltage controlled oscillator (VCO) used to generate the drive frequency. With this technique, the circuit is intended to operate above the resonant frequency peak on the inductive or high frequency shoulder of the high-Q piezoelectric transformer response curve. In this approach, the control loop is closed by monitoring the piezoelectric transformer output voltage or current, and forcing the VCO to a frequency above resonance which can maintain this output level. This approach can maintain output regulation over a limited but useful range. Moreover, this approach can perform even with modest resonant frequency changes caused by aging, temperature, load variation and other factors.

Because this approach does not actually track the high-Q resonant frequency of the piezoelectric transformer, this approach makes use of frequency sweeps to find the initial operating point, to recover from transient conditions, and to respond to changes in the output regulation setpoint. The narrowband high-Q characteristics of piezoelectric transformers requires careful initial tuning and accurate operating frequency windows. If the VCO frequency drops below the resonant frequency peak of the piezoelectric transformer, operating instabilities will occur.

A preferred approach for frequency control is described in detail in a patent application (Ser. No. 08/852,505 filed on May 7, 1997) titled "Single-Input Phase Locking Piezoelectric Driving Circuit" assigned to Motorola, Inc. That patent application is incorporated herein by reference.

Piezoelectric transformer input sections are characterized by a shunt input capacitance which may exceed tens of nano-farads. It is important to try to minimize harmonic content in the piezoelectric transformer drive waveform. Input drive harmonics may be rejected by the high-Q transformer thereby reducing drive efficiency. Another undesirable scenario would be if the input drive harmonics excited spurious modes in the transformer which would be difficult to suppress.

Many prior art drive circuit configurations provide direct drive by means of a power amplifier. Power amplifier drivers typically produce a continuous sinewave drive signal which sacrifices efficiency for low harmonic content. Another drawback to power amplifier drivers is that they have difficulty driving large capacitance values.

Still another option is to use switched totem-pole half-bridge drivers, but they also have limitations. Half-bridge drivers typically produce a squarewave drive signal which contains significant harmonic content. Half-bridge drivers may also produce large current transients in the piezoelectric transformer input section due to the capacitive nature of the piezoelectric transformer input.

Several prior art approaches have been disclosed to regulate the output voltage or current of a piezoelectric transformer based converter. The closed loop "VCO frequency above resonance" technique was discussed in detail above. Another technique disclosed in the prior art is Pulse Width Modulation (PWM). PWM drive harmonics, like their switched totem-pole bridge drive cousins, sacrifice drive efficiency because of their significant harmonic content. PWM drives may also excite spurious vibrational modes in the piezoelectric transformer.

In another output regulation approach described in the prior art, the DC voltage supplying the driver circuit is controlled by either a linear or a switching regulator which in turn is controlled by feedback from a piezoelectric transformer output voltage or current monitor. Linear regulators are quite inefficient in this application, so switching regulators are generally preferred. Unfortunately, switching regulators add their own inefficiency to that of the piezoelectric transformer and the associated drivers. Another drawback to switching regulators is that they may also require at least one low-loss power inductor and at least one low ESR output filtering capacitor in addition to the switching regulator controller and the associated power switches.

Many different resonant drive circuit configurations have been used in the prior art. These resonant drive circuits include those which use an inductor which resonates with the input capacitance of the piezoelectric transformer and those which employ a step-up transformer which resonates with the input capacitance of the piezoelectric transformer. A resonant drive circuit which satisfies the accepted criteria for Zero Voltage Switching (ZVS) is a desirable piezoelectric transformer drive configuration. Examples of prior art resonant ZVS drive circuits are shown in FIGS. 1 through 5.

FIG. 1 shows a single ended unregulated resonant drive circuit used with both magnetic and piezoelectric transformer power converters in accordance with the prior art. Referring to FIG. 1, a piezoelectric transformer 102 is shown with dashed lines. A capacitance $C_{IN}$ is shown across the input of piezoelectric transformer 102 and represents the equivalent input capacitance of piezoelectric transformer 102.

An input drive frequency 104 is applied to switch $S_1$. Also included in the circuit is supply voltage V+, reference voltage point $V_1$, and output voltage $V_0$. Also shown in FIG. 1 is a load resistance $R_L$ and an inductance $L_1$.

FIG. 2 shows a timing diagram illustrating the circuit waveforms generated by the circuit of FIG. 1 in accordance with the prior art. Referring to FIG. 2, the top waveform shows the $S_1$ drive alternatively in the "off" and "on" positions at approximately a 50% duty factor. When $L_1$ and $C_{IN}$ are selected to resonate at the input drive frequency, a pseudo half sinewave drive waveform will be seen at $V_1$. This is also shown in FIG. 2.

FIG. 3 shows a "push-pull" unregulated resonant drive circuit used with both magnetic and piezoelectric transformer power converters in accordance with the prior art.

Referring to FIG. 3, a piezoelectric transformer 302 is provided and shown with dashed lines. $C_{IN}$ represents the equivalent input capacitance of piezoelectric transformer 302. In FIG. 3, two switches $S_1$ and $S_2$ are also shown, each connected to a separate inductance $L_1$ and $L_2$, respectively. $R_L$ is the output load. Voltage reference points $V_1$ and $V_2$ are provided on either side of the piezoelectric transformer 402.

FIG. 4 shows a timing diagram illustrating the circuit waveforms generated by the circuit of FIG. 3 in accordance with the prior art. Referring to FIG. 4, the first two waveforms show switch $S_1$ and switch $S_2$, respectively. Note that switches $S_1$ and $S_2$ are driven 180° out of phase with each other at approximately a 50% duty factor. The third and fourth waveforms show a signal at reference points $V_1$ and $V_2$, respectively. When $L_1$ and $L_2$ are selected to resonate with $C_{IN}$ at the drive frequency, then $V_1$ and $V_2$ are both alternate periodic positive pseudo half-sinewaves. The fifth waveform shows the voltage across $(V_2-V_1)$. Significantly, the voltage across $(V_2-V_1)$ produces a full pseudo sinewave across the input of piezoelectric transformer 302.

Circuits which use the resonant drive approach usually achieve output regulation by employing a switching regulator to control the supply voltage (V+). This has the disadvantages attributed to the use of switching regulators as described above.

FIG. 5 shows a "push-pull" regulated resonant drive circuit used with a piezoelectric transformer power converter in accordance with the prior art. Most of the elements shown in FIG. 5 have been described in FIGS. 1–4 above and that discussion is incorporated herein by reference. FIG. 5 shows a piezoelectric transformer 502 provided in dashed lines. FIG. 5 also shows how switch $S_1$ and switch $S_2$ may be connected to a voltage controlled oscillator (VCO) 504 having a VCO-controller 506 connected thereto. Also shown in FIG. 5 is an intermittent control 508 having a duty factor control 510 connected to the circuit. The prior art circuit of FIG. 5 employs the closed loop "VCO frequency above resonance" approach to regulate the output voltage.

FIG. 5 also shows a pulse frequency modulation regulation scheme which gates the resonant drive switches with a digital PWM disable signal. By gating the switches "off" for variable periods, the average drive power into the piezoelectric transformer can be changed, thus changing the average output voltage or current. This approach has several disadvantages in practice, as will be described below.

Referring to FIG. 1, it can be seen that when switch $S_1$ is disabled for several cycles, capacitor $C_{IN}$ will charge through $L_1$ to V+. When $S_1$ is enabled and the next resonant ZVS cycle begins, the voltage on $C_{IN}$ will be shorted by $S_1$, resulting in a large surge current in $C_{IN}$ and $S_1$, and in dissipative losses which reduce efficiency. If the disable signal occurs while $S_1$ is closed and current is flowing in $L_1$, opening $S_1$ will cause a large dI/dT through $L_1$ which will, in turn, produce a large and potentially damaging voltage spike across $S_1$. Similar effects are seen in the dual or differential resonant drive configurations shown in FIGS. 3 and 5.

Another undesirable effect caused by prior art pulse frequency modulation regulation involves the high-Q mechanical resonant characteristics of the piezoelectric transformer. When a piezoelectric transformer is driven at resonance and then the input drive is abruptly disabled, the transformer will continue to resonate for a time period determined by the mechanical Q and the input and output loading of the transformer. During this time, the piezoelectric transformer input acts like an AC generator, sourcing voltage and current back into the drive circuitry. Solid state transistor and mosfet switches commonly used to realize $S_1$ and $S_2$ in FIGS. 1, 3, and 5 include collector-to-emitter or drain-to-source diodes which will selectively clamp this piezo-generator signal to ground and thus modulate the driven impedance seen by the piezo-generator.

This mode of operation can dissipate the resonant energy stored in the piezoelectric transformer and also cause an undesirable shift in the resonant frequency of the transformer. These undesirable effects are repeated each time the resonant drive circuit is cycled by the PWM disable signal.

A need exists for an improved driving circuit for a piezoelectric transformer based power converter which allows the piezoelectric transformer to operate at or near its resonant frequency; the driving circuit should track changes in the resonant frequency due to aging, temperature, load variation, and other factors; the driving circuit should be efficient and generate minimal drive signal harmonics; the drive circuit should also be able to regulate the transformer output voltage or current efficiently; the driving circuit should also effectively reduce the number and cost of added components.

A pulse frequency modulation drive circuit for a piezoelectric transformer which controls the piezoelectric output current or voltage by selectively gating integral half cycles of a pseudo-sinewave drive operating at the resonant frequency of the piezoelectric transformer would be a substantial contribution to the art.

DETAILED DESCRIPTION OF A PREFERRED EMBODIMENT

The present invention is a pulse frequency modulation drive circuit which is well suited for use with a piezoelectric transformer. An advantage of this circuit over the prior art (see FIGS. 1–5) is the fact that the piezoelectric transformer may be operated at or near it's resonant frequency under all load conditions, while at the same time providing a simple and efficient mechanism to adjust or regulate the output voltage or current.

The present invention successfully addresses a fundamental problem common in piezoelectric transformer applications, namely that simultaneous resonant frequency control and output level regulation is difficult to achieve with these high-Q narrow bandwidth devices which have an inherently variable resonant frequency.

This problem is solved by the instant invention which provides a circuit which regulates the piezoelectric transformer output current or voltage by selectively gating integral half cycles of a pseudo-sinewave into the piezoelectric transformer at or near the resonant frequency of the piezoelectric transformer.

The present invention employs a novel switching configuration in the circuit, which will be discussed in greater detail below, which allows the average output of the piezoelectric transformer to be regulated. Output regulation is achieved by pulse frequency modulating the input of the piezoelectric transformer with an integral number of half-cycle sinewaves. Although the high-Q piezoelectric transformer is only being driven intermittently with this series of sinewave pulses, the output of the transformer remains essentially continuous, thereby allowing feedback from the piezoelectric transformer to be used to maintain the drive signal frequency at or near the resonant frequency of the piezoelectric transformer.

One advantage of this approach can be understood using the analogy of a flywheel. Just as a flywheel requires significant energy to get started, and only minimal energy to maintain it's velocity, so too does a high-Q piezoelectric transformer require a relatively significant amount of energy to reach it's full output at resonance, and only a relatively small amount of energy to maintain it's resonant operating point. The present invention exploits the flywheel like characteristics of a high-Q piezoelectric transformer to achieve greater efficiencies.

Another advantage of the present invention is that it inhibits "mode-hopping" or operation of the transformer in spurious resonant modes. The use of integral half-cycle sinewave drive waveforms also minimizes drive harmonics. Moreover, the use of synchronous sequential switching eliminates inductive voltage spikes and capacitive energy dumps. Another advantage of the instant circuit design is that the use of resonant Zero Voltage Switching (ZVS) minimizes switching losses and increases the effective step-up ratio of the piezoelectric transformer.

Figure 1:
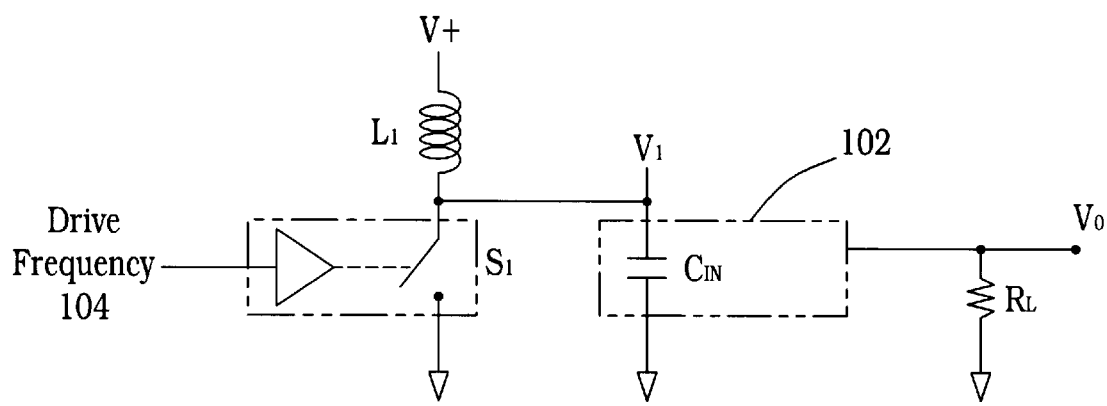
FIG. 1 shows a single ended unregulated resonant drive circuit used with both magnetic and piezoelectric transformer power converters in accordance with the prior art.
Figure 2:
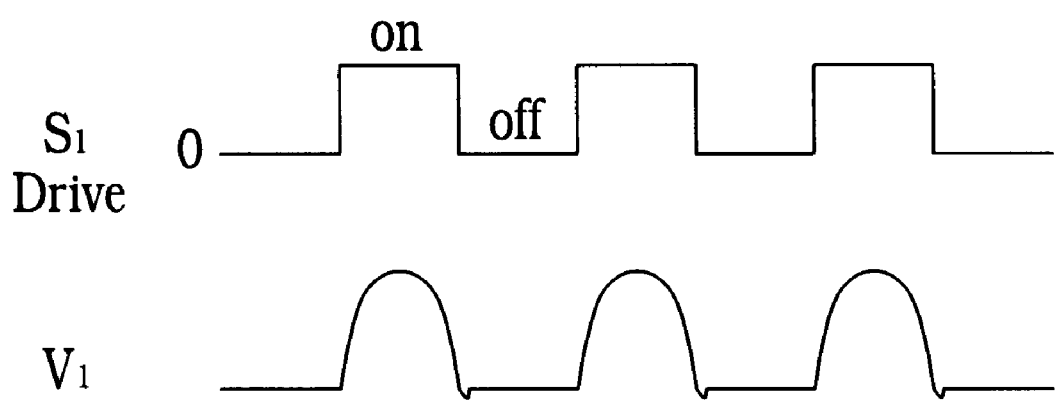
FIG. 2 shows a timing diagram illustrating the circuit waveforms generated by the circuit of FIG. 1 in accordance with the prior art.
Figure 3:
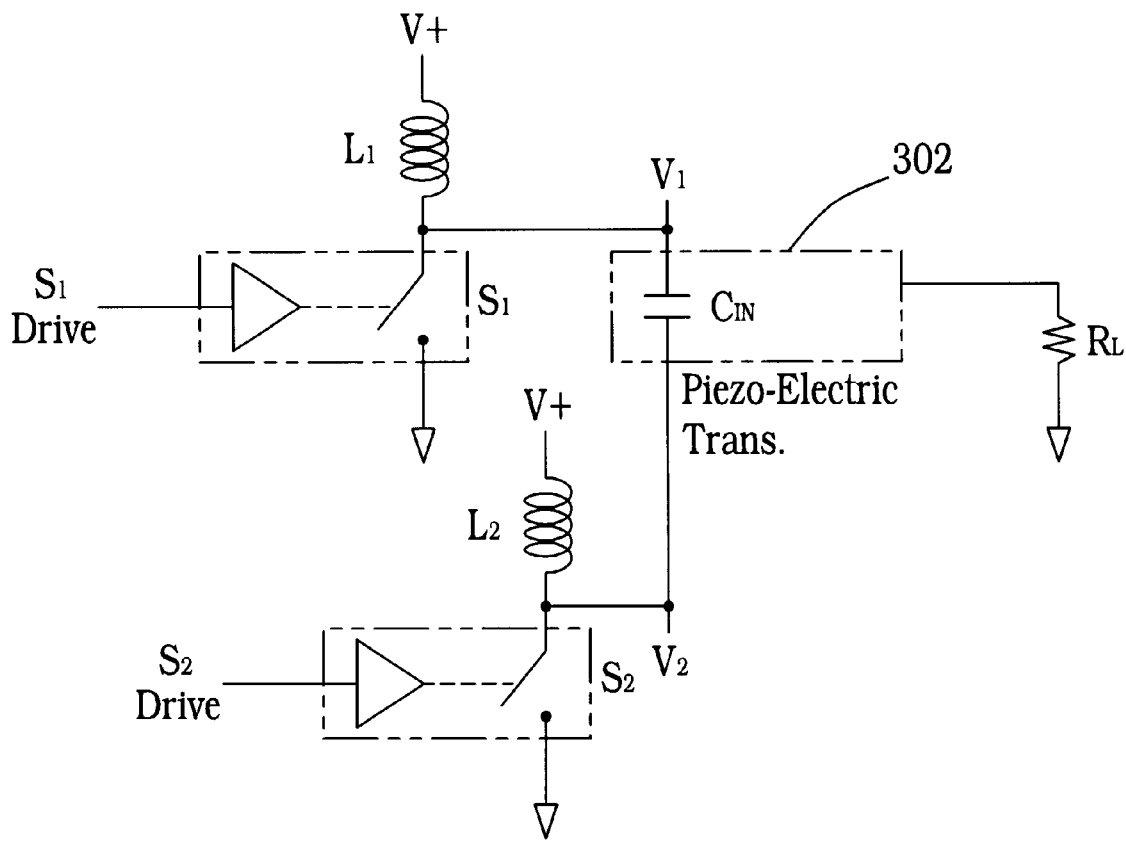
FIG. 3 shows a "push-pull" unregulated resonant drive circuit used with both magnetic and piezoelectric transformer power converters in accordance with the prior art.
Figure 4:
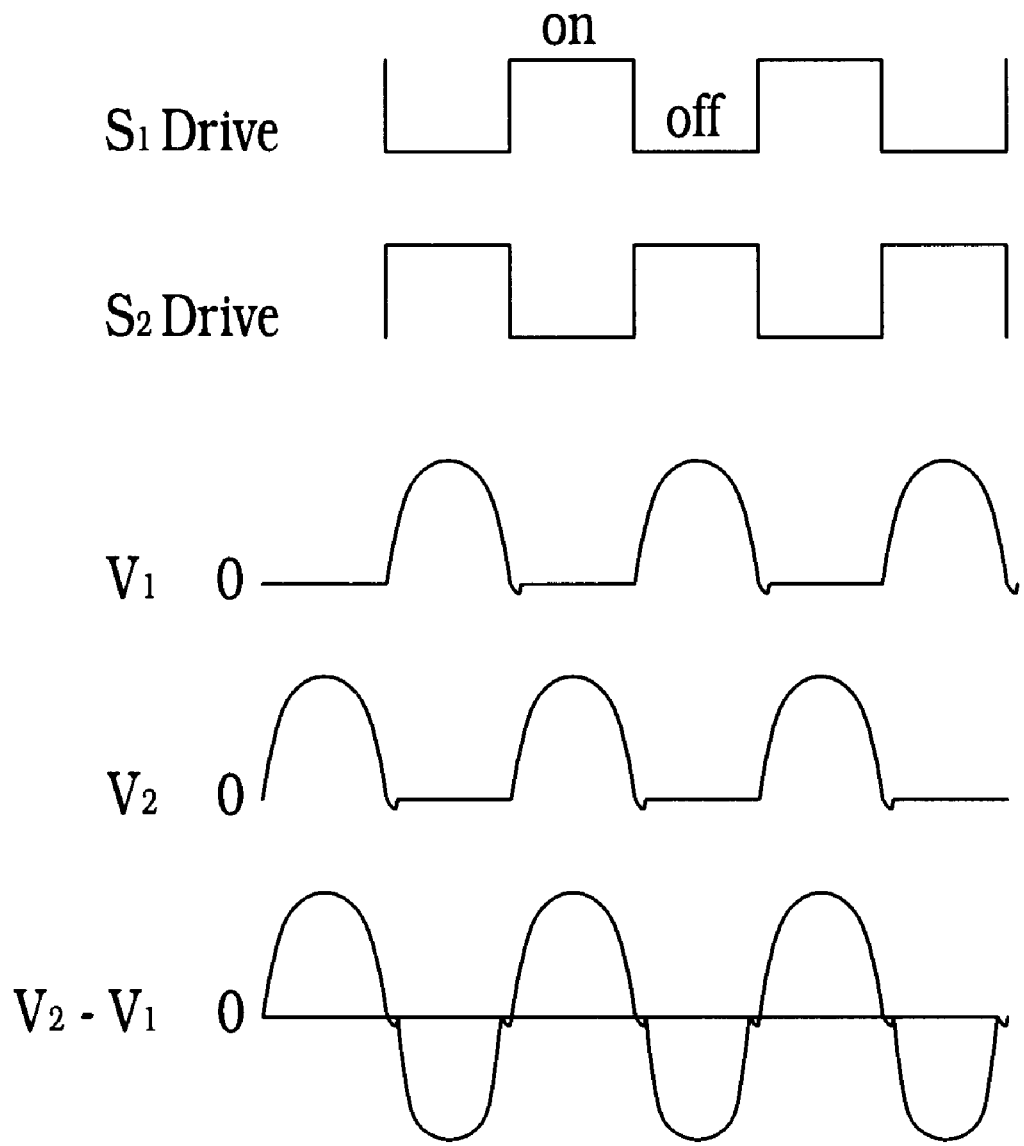
FIG. 4 shows a timing diagram illustrating the circuit waveforms generated by the circuit of FIG. 3 in accordance with the prior art.
Figure 5:
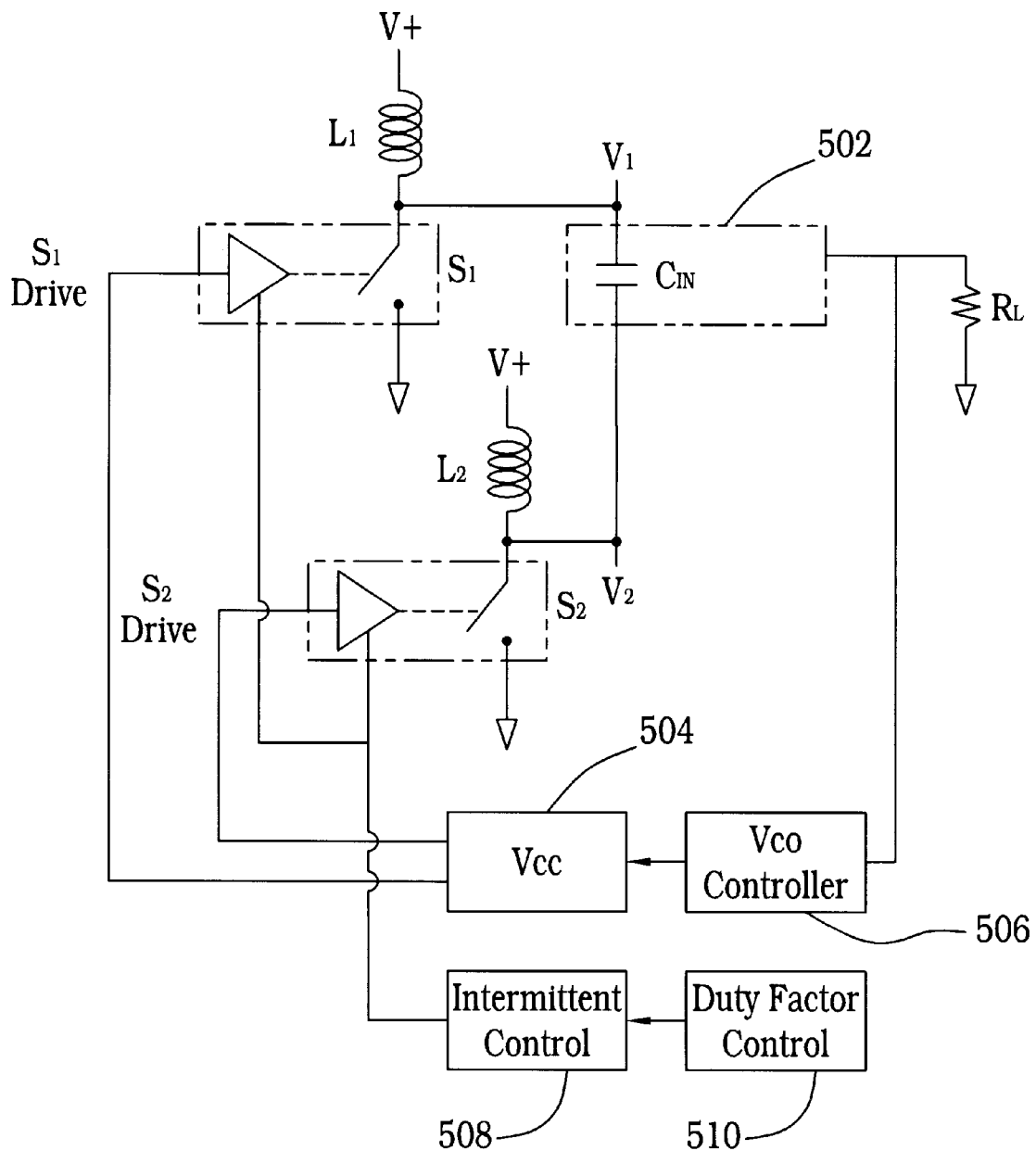
FIG. 5 shows a "push-pull" regulated resonant drive circuit used with both magnetic and piezoelectric transformer power converters in accordance with the prior art.
Figure 6:
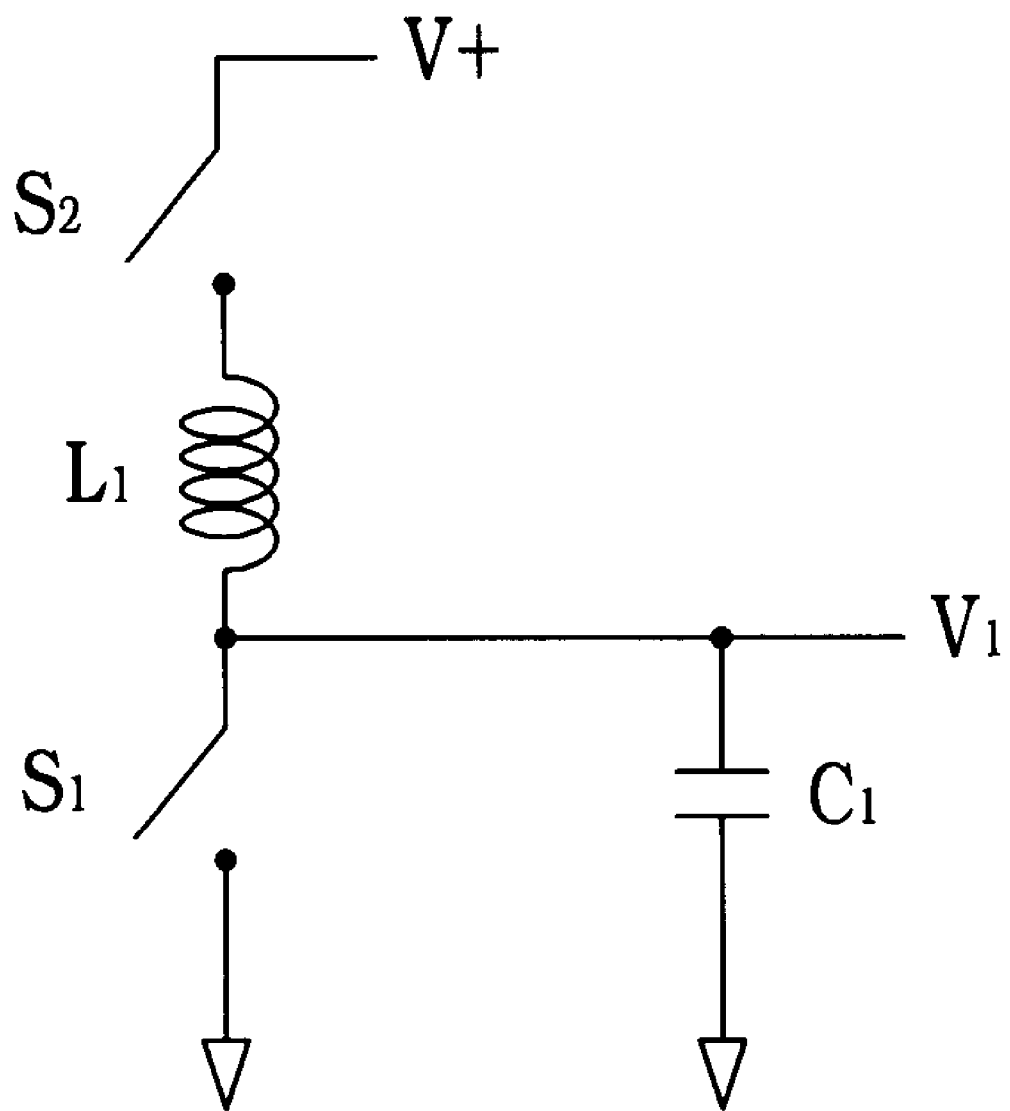
FIG. 6 shows a single ended resonant drive circuit for a piezoelectric transformer in accordance with the present invention.

An understanding of the Applicant's invention, as it relates to a switching circuit may be found with reference to FIGS. 6–11. Referring first to FIG. 6, a circuit comprising a first switch $S_1$ and a second switch $S_2$, as well as an inductor $L_1$ and a capacitor $C_1$. Capacitor $C_1$ represents the effective input capacitance of a piezoelectric transformer. The value of inductor $L_1$ is selected to resonate with capacitor $C_1$ at the driven switching frequency of switch $S_1$. A supply voltage V+ is shown, as is a voltage reference point $V_1$.

This circuit is novel and unique because of the significant addition of switch $S_2$. When switch $S_2$ is closed (in the "on" position), the circuit of FIG. 6 produces a classic ZVS waveform at voltage reference point $V_1$. This is shown in the first half of the timing waveform provided in FIG. 7. However, when switch $S_2$ is gated synchronously with the driven frequency of $S_1$ (as shown in the timing diagram waveform of FIG. 7), the waveform at $V_1$ will consist of an integral number of half-cycle sinewaves as determined by the duty cycle of the switch $S_2$ control signal. Moreover, there will be substantially no of inductive spikes when switch $S_2$ is turned in the "off" position, and there will be substantially no capacitive energy dump when $S_2$ is turned in the "on" position.

Figure 8:
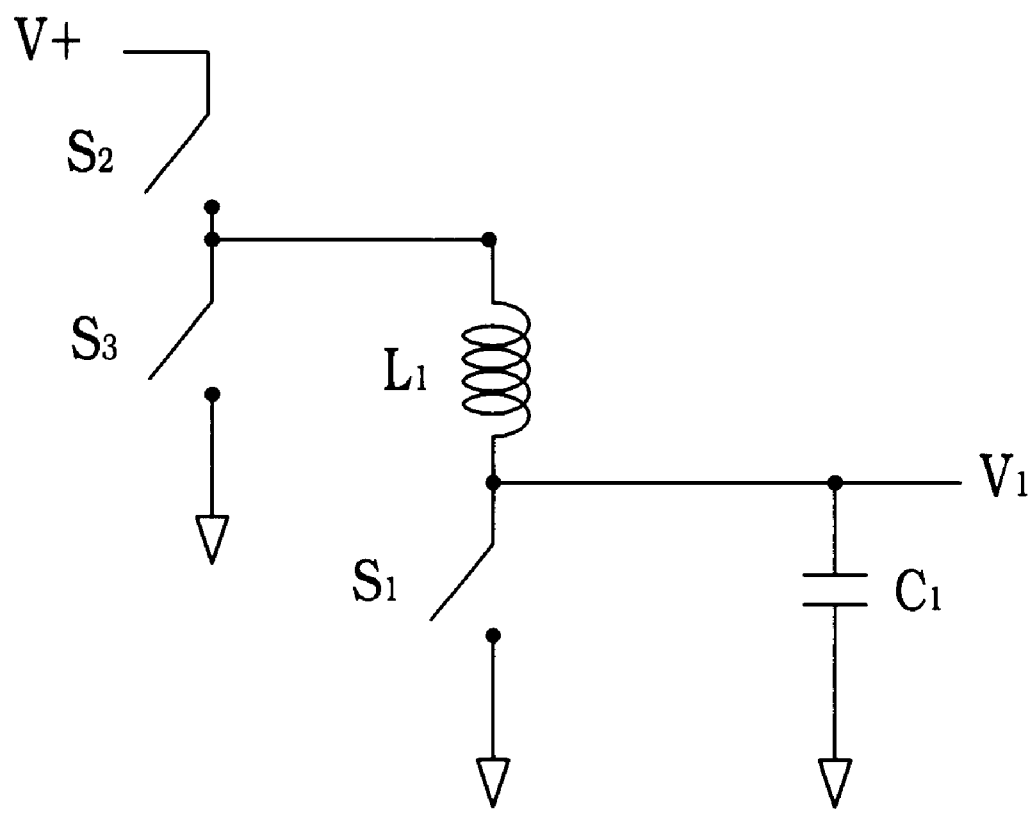
FIG. 8 shows another embodiment of a single ended resonant drive circuit for a piezoelectric transformer in accordance with the present invention.

An alternative switching configuration which may produce an equivalent gated waveform at voltage reference point $V_1$ is shown in FIG. 8. This shows another embodiment of a single ended resonant drive circuit for a piezoelectric transformer in accordance with the present invention. Referring to FIG. 8, a circuit having an inductor $L_1$ and a capacitor $C_1$ along with switches $S_1$ and $S_2$ is provided. Input voltage V+ and voltage reference point $V_1$ are also provided in this circuit. This circuit is similar to the one shown in FIG. 6 (discussed above) with the significant addition of a third switch $S_3$. In FIG. 8, switches $S_2$ and $S_3$ form a standard totem-pole or half-bridge drive. Switch $S_3$ is driven approximately 180° out of phase with switch $S_2$, and break-before-make switching is assumed.

Figure 7:
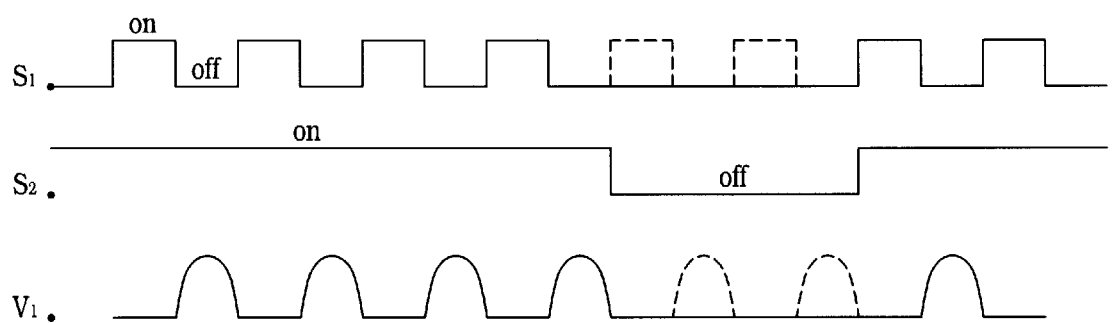
FIG. 7 shows a timing diagram illustrating the circuit waveforms generated by the circuit of FIG. 6 in accordance with the present invention.

The timing diagram waveforms shown in FIG. 7 are also applicable to the circuit of FIG. 8. The circuit of FIG. 8 is slightly more complicated with the addition of the third switch $S_3$, however, this feature may prove useful for certain applications. With this configuration, the drive impedance seen by the input of the piezoelectric transformer at $C_1$ remains essentially constant regardless of whether $S_2$ is in the "on" or "off" position.

Figure 9:
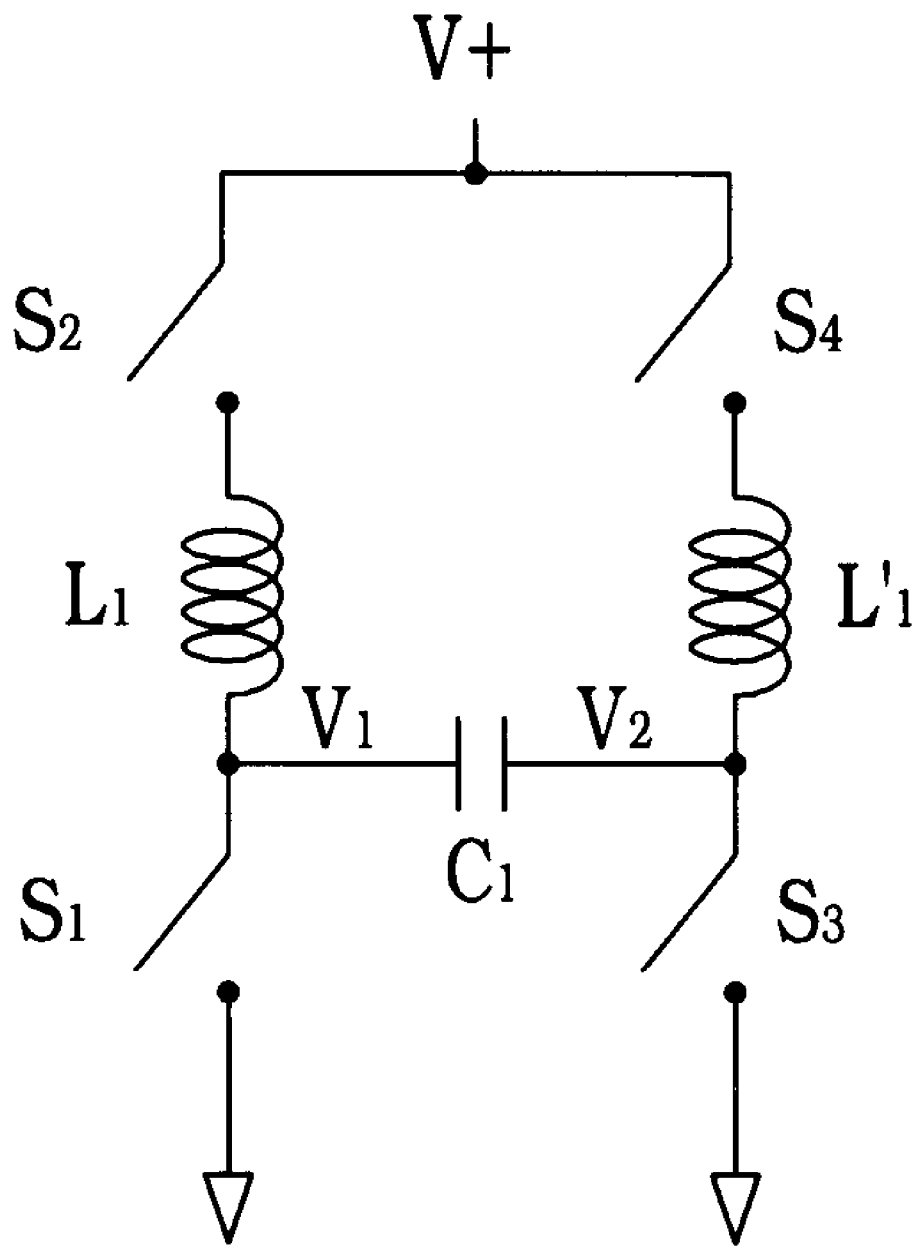
FIG. 9 shows a differential resonant drive circuit in accordance with the present invention.

Another level of sophistication is achieved with the differential drive circuit shown in FIG. 9. FIG. 9 shows a differential resonant drive circuit in accordance with the present invention. Referring to FIG. 9, the circuit has four switches, switch $S_1$, switch $S_2$, switch $S_3$, and switch $S_4$, respectively. Also provided are inductors $L_1$ and $L_1'$, input voltage V+, as well as voltage reference points $V_1$ and $V_2$. Capacitor $C_1$ is also shown in FIG. 9 between $V_1$ and $V_2$. Capacitor $C_1$ represents the effective input capacitance of a piezoelectric transformer.

The values of inductors $L_1$ and $L_2$ are selected to be resonant with capacitance $C_1$ at the driven switching frequency of switches $S_1$ and $S_2$. When $S_2$ and $S_4$ are closed (in the "on" position"), the circuit in FIG. 9 produces a classic ZVS waveform at $V_1$ and $V_2$ as is shown in the first half of the timing diagram waveform in FIG. 10. In this case, the differential drive signal across capacitance $C_1$ at the input of the piezoelectric transformer will closely approximate a sinewave.

Figure 10:
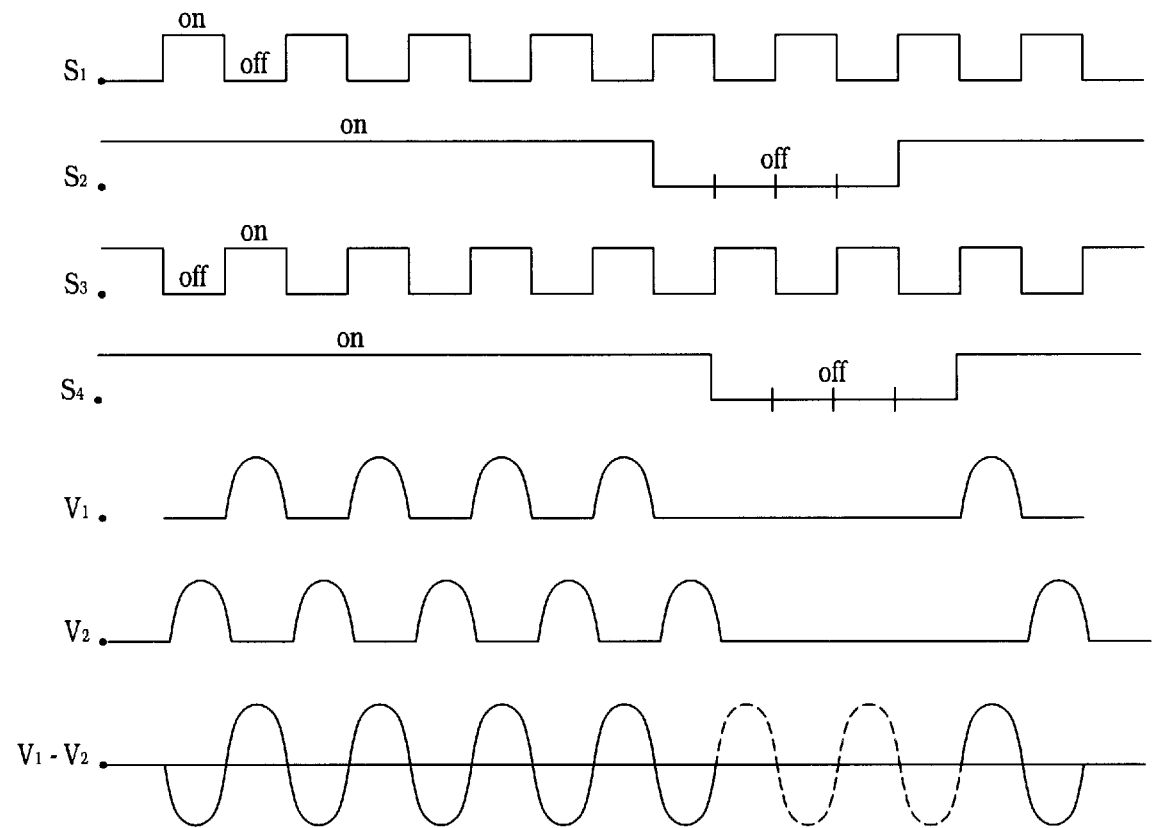
FIG. 10 shows a timing diagram illustrating the circuit waveforms generated by the circuit of FIG. 9 in accordance with the present invention.

However, when switches $S_2$ and $S_4$ are gated synchronously with the driven frequency of $S_1$, as is shown in the timing diagram of FIG. 10, the waveforms at voltage reference points $V_1$ and $V_2$ will consist substantially of an integral number of half-cycle sinewaves as determined by the duty cycle of the $S_2$ and $S_4$ control signal. Significantly, there will be substantially no inductive spikes when $S_2$ or $S_4$ are placed in the "off" position. Furthermore, there will be substantially no capacitive energy dump when $S_2$ or $S_4$ are placed in the "on" position and substantially no partial or abbreviated drive cycles are generated.

Another important advantage of the circuit described in FIGS. 9 and 10 can be realized with the novel four switch design. Because switches $S_1$ and $S_3$ can be allowed to continue switching at the driven frequency during the interval when $S_2$ and $S_4$ are in the "off" position, the piezoelectric transformer may function as a generator, driving voltage back into the switching circuit without being clamped by the reverse diodes commonly found across solid state realizations of $S_1$ and $S_3$.

It may also be appreciated that the switching configuration shown in FIG. 9 can be modified with the addition of still two more switches, one to form a half-bridge with $S_2$ and another to form a half-bridge with $S_4$, in a manner analogous to that shown in FIG. 8 (discussed above) for the single ended drive embodiment. This may be advantageous in some applications because the drive impedance seen from the piezoelectric transformer input will be essentially constant, regardless of whether switches $S_2$ and $S_4$ are closed or open (in the "on" or "off" position).

Figure 11:
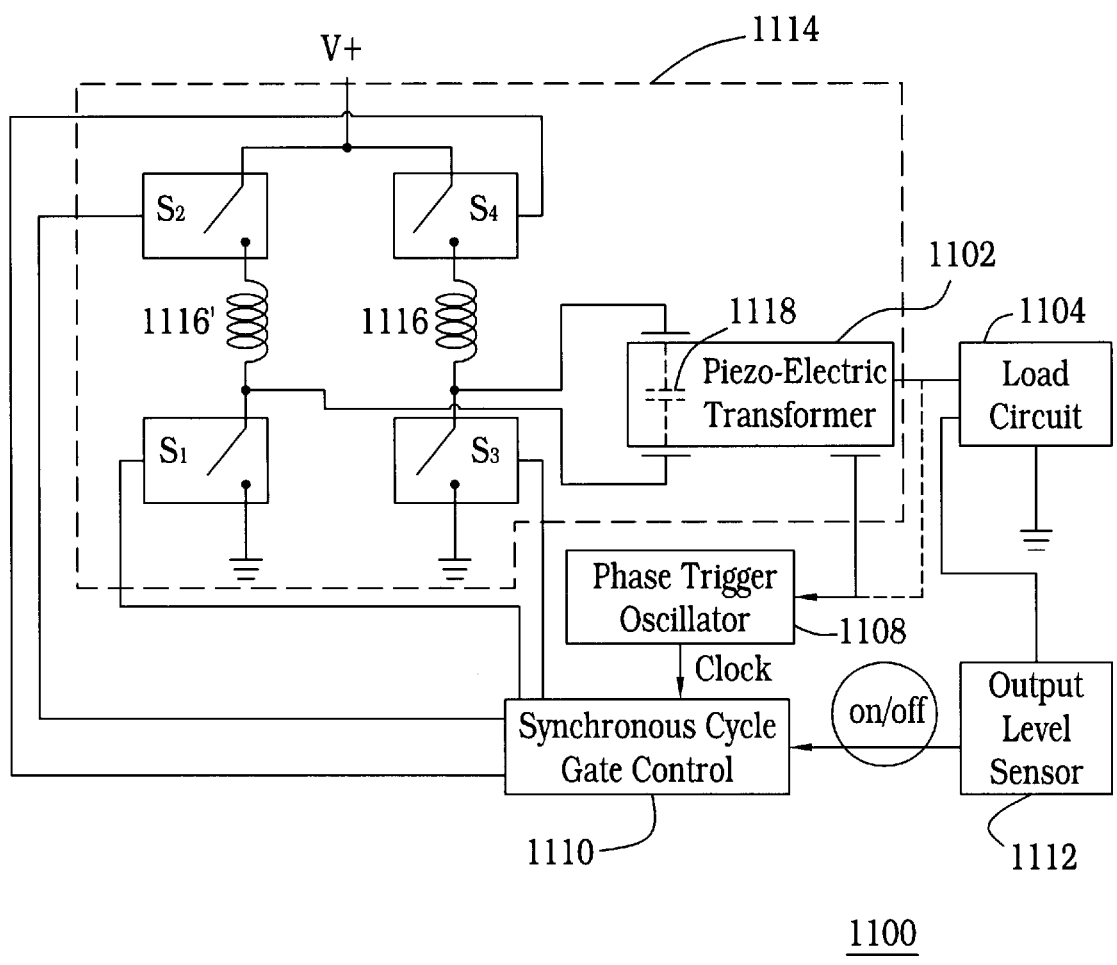
FIG. 11 shows a block diagram of a regulated power converter which employs a pulse frequency modulation drive circuit for a piezoelectric transformer in accordance with the present invention.

FIG. 11 shows, in block diagram form, one embodiment of the pulse frequency modulation drive circuit for a piezoelectric transformer of the present invention. The piezoelectric transformer based power converter circuit 1100 is provided in FIG. 11 and comprises a piezoelectric transformer 1102 coupled to a load circuit 1104 which is connected to ground. Piezoelectric transformer 1102 also drives a phase triggered oscillator 1108, which is coupled to a synchronous cycle gate control 1110. The output level at the load circuit 1104 is monitored by output level sense 1112 which also feeds the synchronous cycle gate control 1110.

The drive circuit in FIG. 11 is shown as a dashed line area which is numbered 1114. Drive circuit 1114 contains a first switch $S_1$, a second switch $S_2$, a third switch $S_3$, and a fourth switch $S_4$. Drive circuit 1114 also includes a pair of inductors 1216 and 1216' as well as capacitor 1118 which represents the equivalent input capacitance of the piezoelectric transformer 1202. Voltage reference points $V_1$ and $V_2$ are also part of drive circuit 1214 and are used to measure relevant waveforms, and input voltage V+ is provided between switches $S_2$ and $S_4$.

Synchronous cycle gate control 1110 switches $S_1$ and $S_3$ at approximately a 50% duty cycle, approximately 180° out of phase with each other, at a frequency determined the phase triggered oscillator 1108. The values of inductors 1116 and 1116' are selected to resonate with capacitor 1118 at the driven frequency, and satisfy the established criteria for a resonant ZVS drive.

Resonant frequency control is established by the closed control loop consisting of switches $S_1$ and $S_3$, piezoelectric transformer 1118, phase triggered oscillator 1108 and synchronous cycle gate control 1110. The buffered feedback signal from the piezoelectric transformer 1102 may actually "pull" or inject current into the trigger circuit of an astable timer or schmitt trigger oscillator to phase lock the timer to the resonant frequency of the piezoelectric transformer 1102. The open loop frequency of the oscillator is set near the target operating frequency of the piezoelectric transformer 1102, so that only the target resonant mode of the transformer will be excited at start-up.

In one embodiment, the preferred feedback signal is supplied by an independent tap on the piezoelectric transformer which is specifically designed to monitor the motional current of the piezoelectric transformer. As an alternative embodiment for a modest dynamic load range, a portion of the output voltage waveform of the piezoelectric transformer may be used as a feedback signal.

The frequency control achieved with this method is monotonic, in other words, stable at only one operating point. This may result in a stable loop phase/frequency control of the operating point of the piezoelectric transformer. In this frequency control loop, the oscillator does not function as a VCO which changes frequency to achieve output regulation. In a preferred embodiment, the only function of the frequency control loop will be to maintain the operating frequency at or just above the target resonant frequency of the piezoelectric transformer.

With the appropriate feedback, the circuit will track changes in the resonant frequency of the piezoelectric transformer due to temperature, mounting stresses, dynamic load changes, and other variables.

Output regulation is achieved by pulse frequency modulating switches $S_2$ and $S_4$. Switches $S_2$ and $S_4$ are sequentially switched synchronously with the driven frequency in response to an asynchronous "on/off" control signal generated by the output level sense 1112. In operation, when the output level at the load 1104 drops below the level sense setpoint, the output level sense 1112 output goes "on". The synchronous cycle gate control 1110 responds to the "on" signal by sequentially enabling switches $S_2$ and $S_4$, and gating an integral number of half sinewave drive waveforms into the input of the piezoelectric transformer 1102. When the output level at the load 1104 exceeds the level sense setpoint, the output level sense 1112 will switch to the "off" position. At this point in time, the synchronous cycle gate control 1110 responds to the "off" signal by sequentially disabling switches $S_2$ and $S_4$, and removing the input drive into the piezoelectric transformer 1102.

During the interval when both switch $S_2$ and switch $S_4$ are in the "off" position, the piezoelectric transformer 1102 will continue to resonate for a time period determined by both the mechanical Q of the transformer and the input and output loading of the transformer. The phase triggered oscillator 1108 will continue to track the resonant frequency of the piezoelectric transformer 1102, and switches $S_1$ and $S_3$ will continue to operate at the driven frequency, thus minimizing energy loss and impedance changes at the transformer input.

A Rosen-type piezoelectric transformer, operating in the length extensional mode, is used in a preferred embodiment of the present invention. However, it should be noted that the circuit of the present invention may be used to drive a multitude of different piezoelectric transformer types which have a variety of different operational modes.

Depending upon the specific application, one of several known output circuits may be used to comprise the load 1104. In one type of load, the output of the piezoelectric transformer may be used to drive an AC device directly. An impedance matching network may also be placed between the piezoelectric transformer output and the load impedance. For DC applications, a rectifier in the form of a diode voltage doubler and a filtering capacitor may be employed. The output parameter which is regulated may be either voltage or current. Many output circuits are well known in the art and may be easily used in conjunction with the present invention by those skilled in the art.

Figure 12:
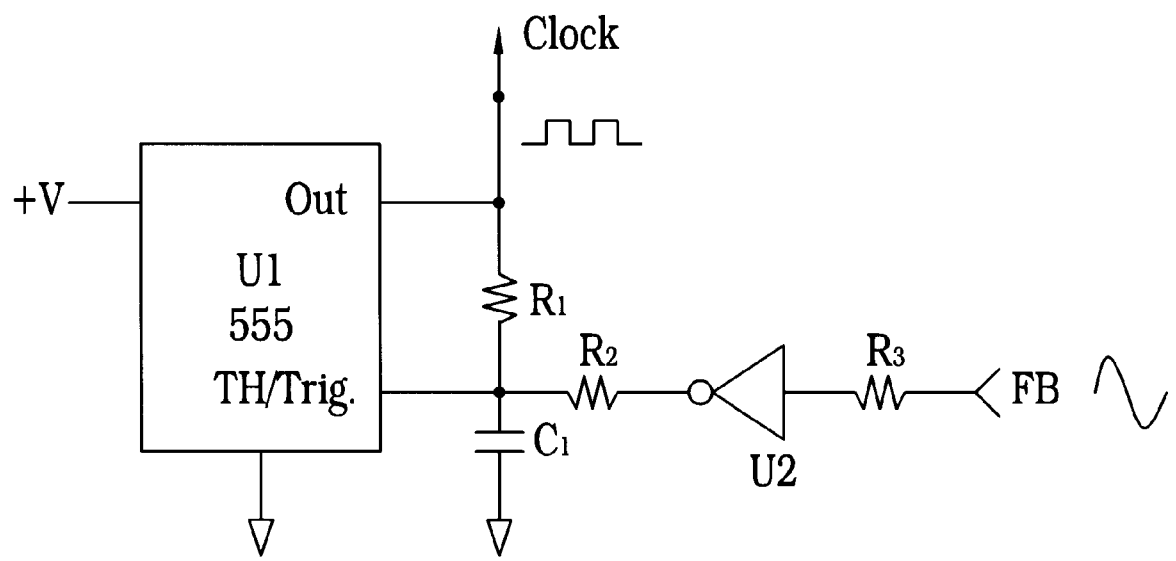
FIG. 12 shows a schematic of one embodiment of block 1108 of FIG. 11 in accordance with the present invention.
Figure 13:
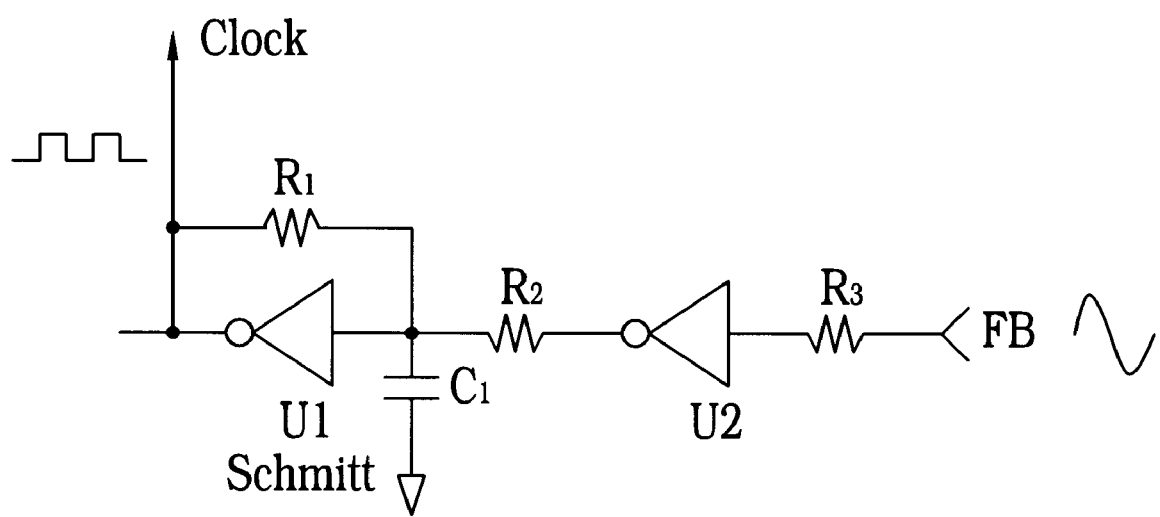
FIG. 13 shows a schematic of another embodiment of block 1108 of FIG. 11 in accordance with the present invention.

FIGS. 12 and 13 may be viewed as alternative embodiments of the phase triggered oscillator. Referring first to FIG. 12, FIG. 12 shows a schematic of one embodiment of block 1108 of FIG. 11, the phase triggered oscillator, in accordance with the present invention. Referring to FIG. 12, a 50% duty cycle squarewave clock is realized with a CMOS 555 timer U1 which is connected in a standard astable configuration. Resistor $R_1$ and capacitor $C_1$ set the nominal frequency of the clock to approximately the target resonant frequency of the piezoelectric transformer. An input voltage V+ as well as a feedback signal (FB) are also shown in FIG. 12. Appropriate feedback from the piezoelectric transformer is applied to resistor $R_3$ which serves as a current limiter at the input to a high input impedance logic gate or comparator U2. The output of comparator U2 is applied at the junction of resistor $R_1$ and capacitor $C_1$ through resistor $R_2$.

When the feedback loop is closed, the feedback signal from the piezoelectric transformer may force the clock frequency to track the feedback frequency with an approximately 90° phase shift. The phase relationship between the feedback signal and the clock can be adjusted over a limited range by adding capacitance to the input of comparator U2.

FIG. 13 shows a schematic of another embodiment of block 1108 of FIG. 11, the phase triggered oscillator, in accordance with the present invention. Many of the elements in the circuit of FIG. 13 are similar to those elements described with reference to FIG. 12, discussed above. That discussion is incorporated herein by reference.

Referring to FIG. 13, a 50% duty cycle squarewave clock is realized with a CMOS Schmitt trigger inverter U1 which is connected in a standard astable configuration. Resistor $R_1$ and capacitor $C_1$ set the nominal frequency of the clock to approximately the target resonant frequency of the piezoelectric transformer. Appropriate feedback from the piezoelectric transformer is applied to resistor $R_3$ which serves as a current limiter at the input to a high input impedance logic gate or comparator U2.

The output of comparator U2 is applied to the junction of resistor $R_1$ and capacitor $C_1$ through resistor $R_2$. When the feedback loop is closed, the feedback signal from the piezoelectric transformer forces the clock frequency to track the feedback frequency with approximately a 90° phase shift. The phase relationship between the feedback signal and the clock can be adjusted over a limited range by adding capacitance to the input of comparator U2.

Figure 14:
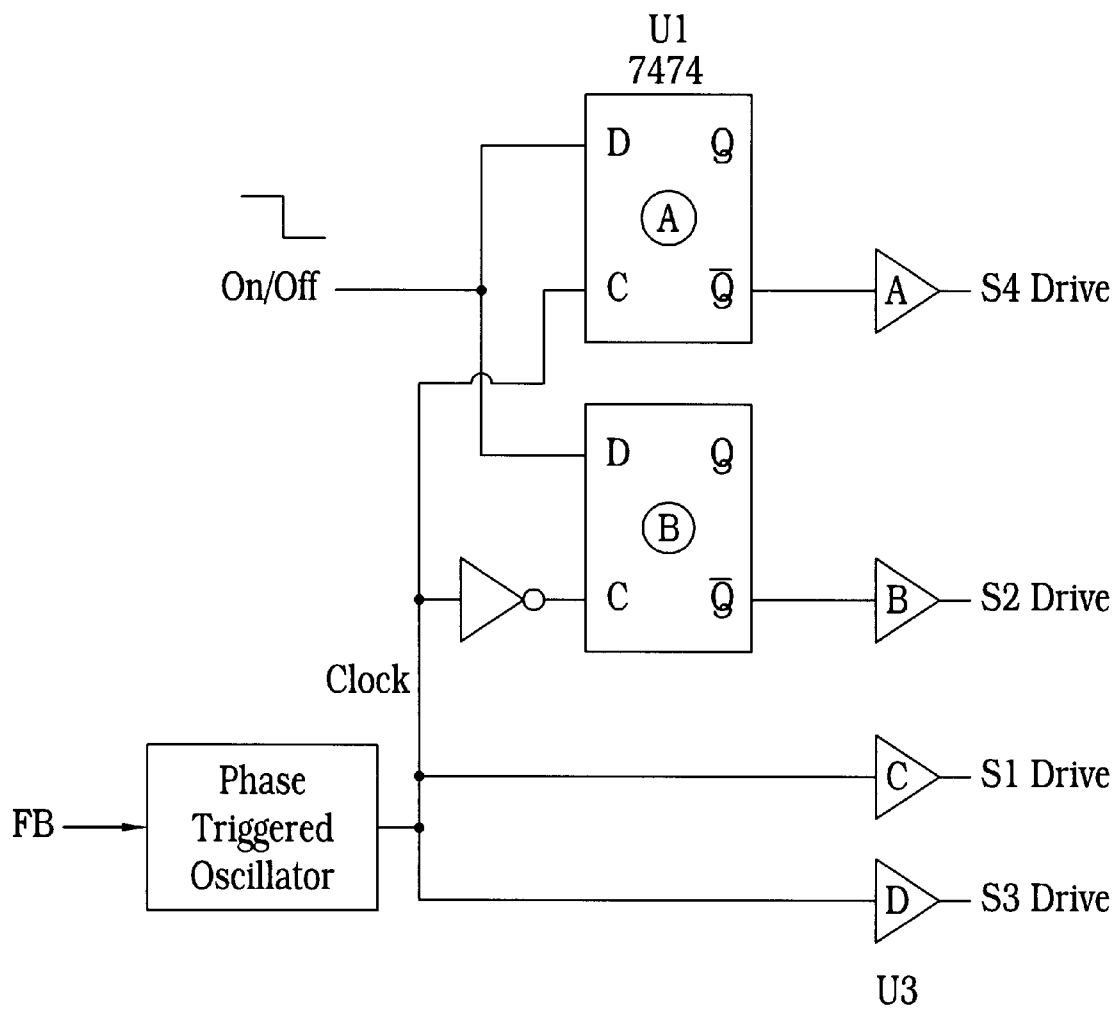
FIG. 14 shows a schematic of one embodiment of block 1110 of FIG. 11 in accordance with the present invention.
Figure 15:
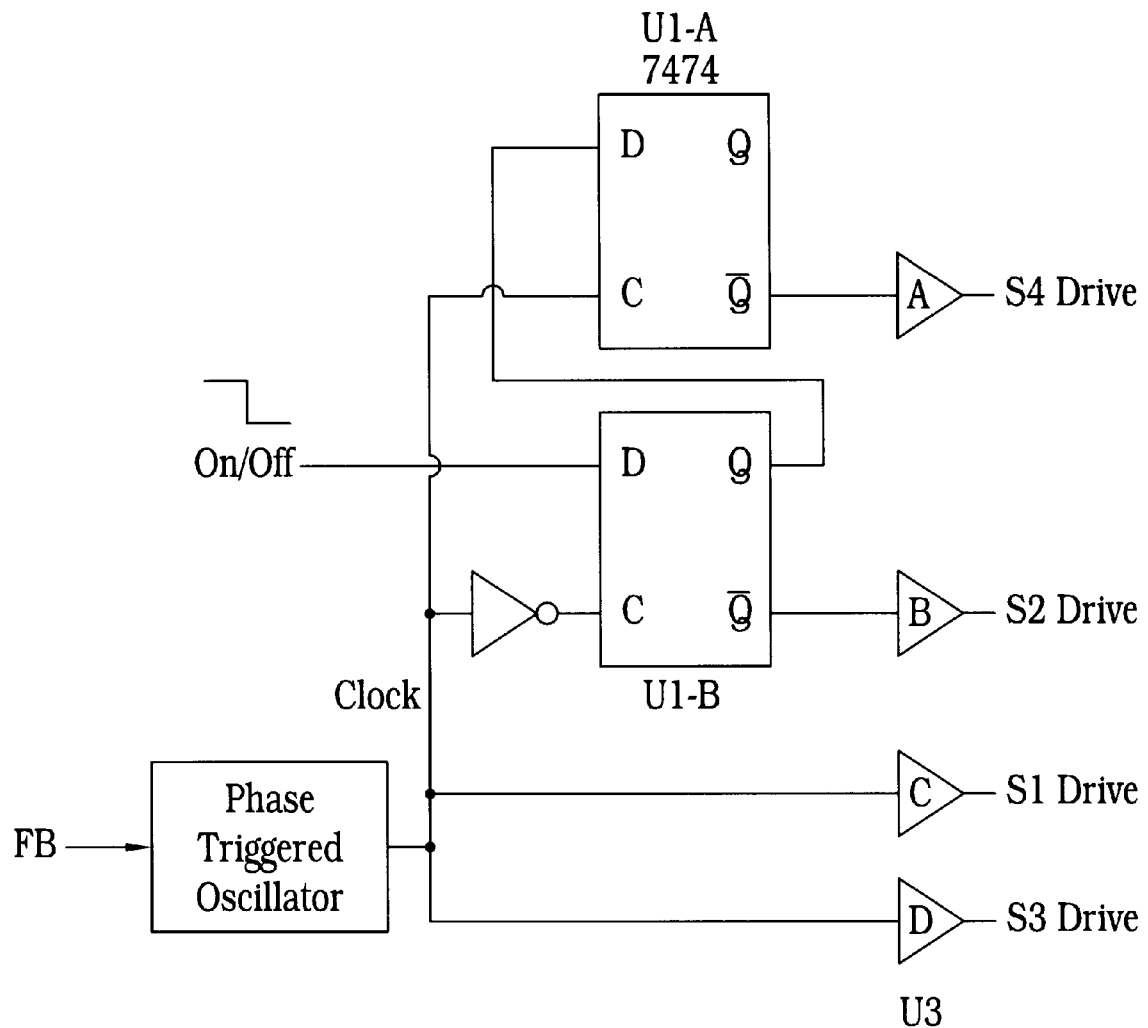
FIG. 15 shows a schematic of another embodiment of block 1110 of FIG. 11 in accordance with the present invention.

FIGS. 14 and 15 are alternate embodiments of the synchronous cycle gate control, described in FIG. 11 as block 1110. FIG. 14 is a schematic diagram of one preferred embodiment of the synchronous gate cycle control 1110 of FIG. 11. In FIG. 14, the phase triggered oscillator clock is used as the master timing signal which determines the switching sequence of the four drive switches, $S_1$, $S_2$, $S_3$ and $S_4$ respectively. Switches $S_1$ and $S_3$ are driven by the clock signal via inverting buffer U3-C and non-inverting buffer U3-D. Switches $S_2$ and $S_4$ are driven via non-inverting buffers U3-A and U3-B, from the corresponding inverted outputs of flip-flops U1-A and U1-B. U1 is a standard 7474 D-type flip-flop. The clock input of U1-A is driven by the clock signal, and the clock input of U1-B is inverted by gate U2. The data inputs of U1 are connected to the asynchronous "on/off" output of the output level sense circuit (block 1112 in FIG. 11).

The circuit configuration shown in FIG. 14 realizes the synchronous drive control sequence required to generate the timing diagrams of FIGS. 7 and 10. The circuit of FIG. 14 drives switches $S_1$ and $S_4$ such that they synchronously gate integral pseudo half sinewave signals to the input of the piezoelectric transformer. This allows the circuit to achieve closed-loop PFM output level regulation.

FIG. 15 is a schematic diagram of another preferred embodiment of the synchronous cycle gate control (block 1110 in FIG. 11). The circuit of FIG. 15 is similar to that of FIG. 14 and the discussion of FIG. 14 above is incorporated herein. One significant difference with FIG. 15 is that the data input of flip-flop U1-A is connected to the non-inverting output of U1-B. The circuit configuration shown in FIG. 15 also realizes the synchronous drive control sequence required to generate the timing diagrams of FIGS. 7 and 10. The circuit of FIG. 15 drives switches $S_1$ and $S_4$ such that they synchronously gate integral pseudo full sinewave drive signals to the input of the piezoelectric transformer to achieve closed-loop PFM output level regulation.

The use of integral full sinewave PFM is preferred in some applications such as those which use a diode voltage doubler to achieve a DC output voltage. A diode voltage doubler may require the first half cycle to charge the series doubler capacitor and the second half cycle to transfer charge to the output capacitor. It will be appreciated by those skilled in the art that other logically equivalent realizations of the circuits of FIGS. 14 and 15 may be constructed. For example, by using a logically equivalent arrangement of NAND gates or NOR gates, a substantially similar result may be achieved.

Figure 16:
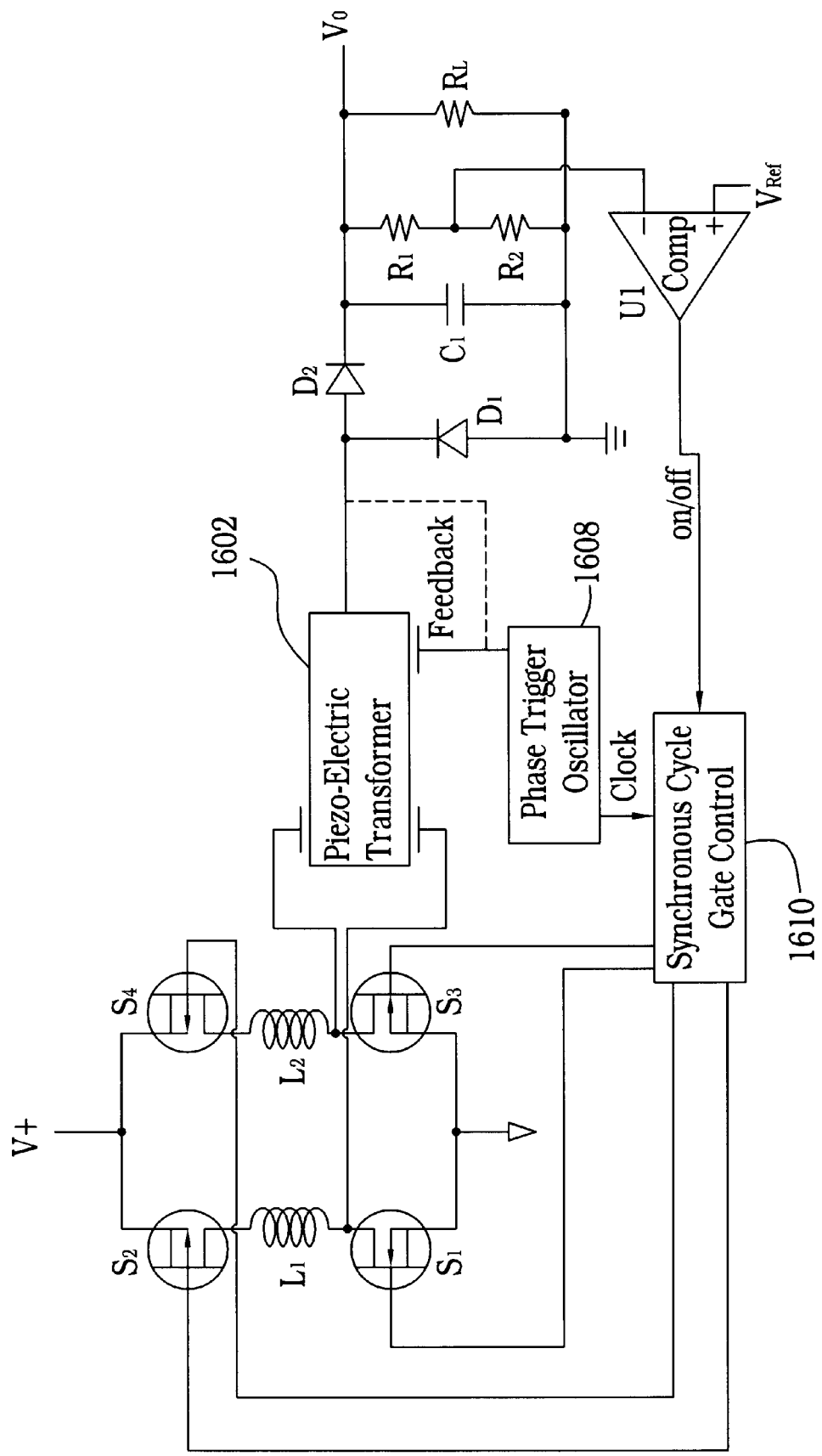
FIG. 16 shows a schematic of another embodiment of the pulse frequency modulation drive circuit for a piezoelectric transformer used in a high voltage power converter application in accordance with the present invention.

FIG. 16 is a schematic diagram of one embodiment of the present invention as applied to a DC high voltage power converter. Many of the elements of this circuit have been discussed previously with reference to FIGS. 6–15 discussed above, and that discussion is incorporated herein.

Referring to FIG. 16, a piezoelectric transformer 1602 drives a diode voltage doubler consisting of high voltage diodes $D_1$ and $D_2$ and high voltage filter capacitor $C_1$. An output load $R_L$ is connected across the filter capacitor $C_1$. A resistive voltage divider is formed by resistor $R_1$ and resistor $R_2$ and is connected to the inverting input of comparator U1, which may be an LMC-339 model manufactured by Texas Instruments, for example.

A voltage reference which sets the regulation level is connected to the non-inverting input of U1. The "on/off" output signal from U1 is an input to the synchronous cycle gate control circuit 1610. The preferred embodiment of the controller circuit for this application is the full sinewave controller shown in FIG. 15. A voltage feedback signal from the piezoelectric transformer 1602 is connected to the phase triggered oscillator circuit 1608. The preferred embodiment of the oscillator circuit for this application is shown in FIG. 12.

Switches $S_1$ and $S_3$ are N-Channel Mosfet transistors such as IRF7103 manufactured by International Rectifier. Switches $S_2$ and $S_4$ are P-Channel Mosfet transistors such as NDS9933 manufactured by Fairchild. Power inductors $L_1$ and $L_2$ may be model number DO-5022 manufactured from Coilcraft, for example. Of course, other vendors and manufacturers may also supply such components as are standard in the industry.

The values of power inductors $L_1$ and $L_2$ are selected so as to resonate with the effective input capacitance of the piezoelectric transformer 1602 at the target resonant frequency of the transformer. Piezoelectric transformer 1602 will be operated at or just above it's target resonant frequency under substantially all operating conditions. Moreover, resonant ZVS switching of switches $S_1$ and $S_3$ will be maintained to minimize switch losses. The DC high voltage output level will be regulated by closed-loop pulse frequency modulation of the input of the piezoelectric transformer with an integral number of pseudo full cycle sinewave drive waveforms.

In the present invention, the average power supply current drawn at a constant power supply voltage is approximately proportional to the average DC load current. The average DC load current is proportional to the drive duty factor. Thus at low average DC load currents, there is a substantially lower average supply current drain because the piezoelectric transformer is only being driven a fraction of the time.

Figure 17:
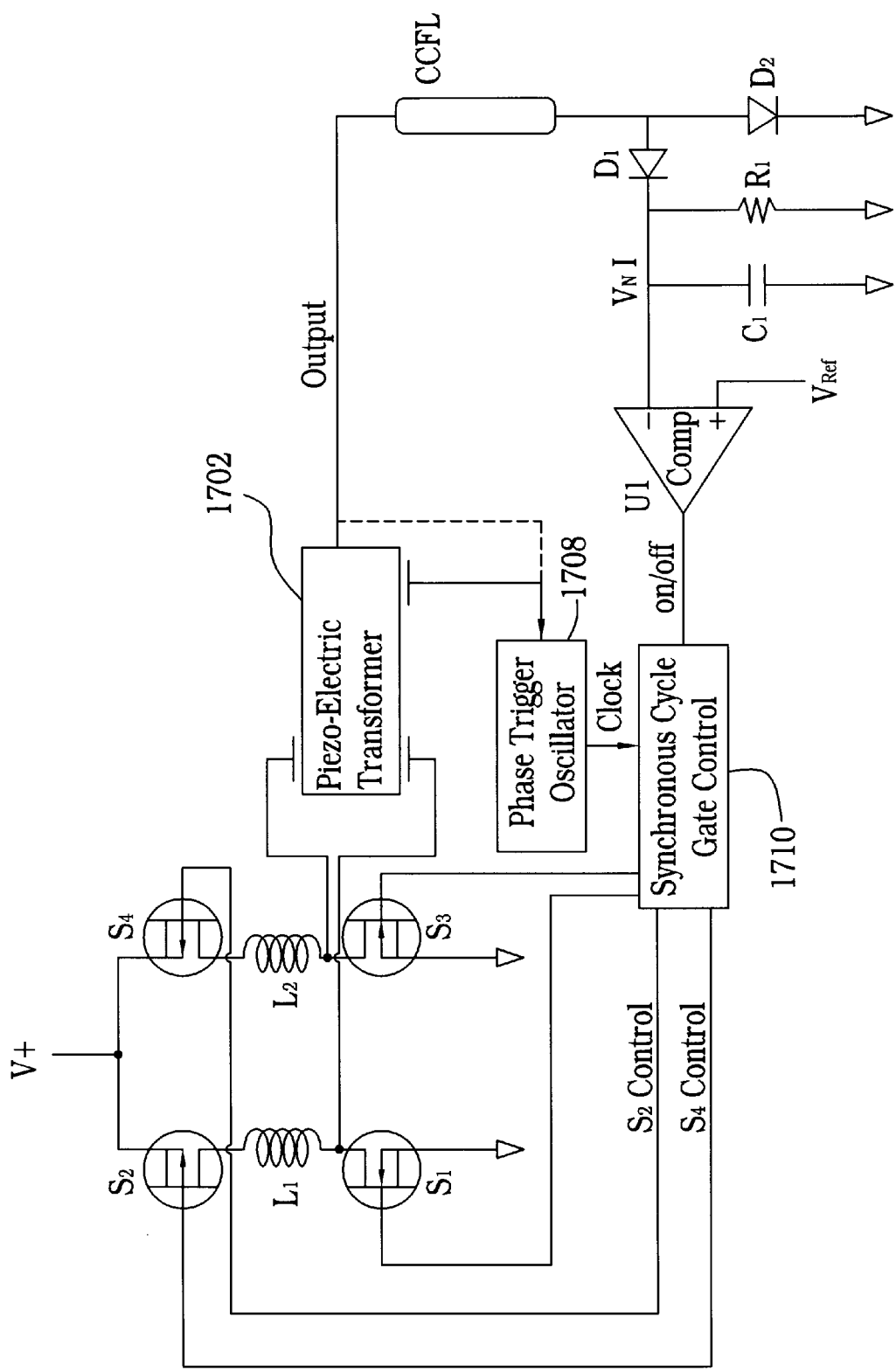
FIG. 17 shows a schematic of another embodiment of the pulse frequency modulation drive circuit for a piezoelectric transformer used in a fluorescent lamp power inverter application in accordance with the present invention.

FIG. 17 shows another specific application of the present invention. Referring to FIG. 17, a schematic diagram of an embodiment of a CCFL (fluorescent) inverter in accordance with the present invention is provided. In this embodiment, a piezoelectric transformer 1702 drives a CCFL lamp. Many of the elements of the circuit of FIG. 17 have been discussed, in detail, previously in the discussion of FIGS. 6–16. That discussion is incorporated herein by reference. In this circuit, the lamp current is rectified in a standard manner by the circuit of diodes $D_1$ and $D_2$, resistor $R_1$, and capacitor $C_1$.

A voltage proportional to the lamp current is applied to the inverting input of comparator U1. A voltage reference, which sets the regulation level, is connected to the non-inverting input of comparator U1. The "on/off" output signal from comparator U1 is an input to the synchronous cycle gate control 1710.

A preferred embodiment of the synchronous cycle gate control 1710 is the embodiment shown in FIG. 14. A voltage feedback signal from the piezoelectric transformer 1702 is connected to a phase triggered oscillator 1708. A preferred embodiment of the phase triggered oscillator circuit 1708 for this application is provided as FIG. 12.

In FIG. 17, switches $S_1$ and $S_3$ are N-Channel mosfet transistors such as model number IRF-7103 provided by International Rectifier, for example. Switches $S_2$ and $S_4$ are P-Channel mosfet transistor such as model number NDS-9933 provided by Fairchild. Power inductors $L_1$ and $L_2$ may be model number DO-5022 from Coilcraft, for example. The values of inductors $L_1$ and $L_2$ are selected to resonate with the effective input capacitance of the piezoelectric transformer 1702 at the target resonant frequency of the transformer.

Piezoelectric transformer 1702 will be operated at or just above it's target resonant frequency under all operating conditions. Resonant ZVS switching of $S_1$ and $S_3$ will be maintained to minimize switch losses. The perceived brightness of the CCFL lamp may be established by regulating the average lamp current by closed loop pulse frequency modulation of the input of the pseudo electric transformer with an integral number of pseudo half sinewave drive waveforms.

Moreover, in the present invention, the average power supply current drawn at a constant power supply voltage is approximately proportional to the average lamp current, which in turn is proportional to the drive duty factor. Thus, at low "brightness" settings, there is a substantially lower average supply current drain because the piezoelectric transformer is only being driven a fraction of the time.

Although various embodiments of this invention have been shown and described, it should be understood that various modifications and substitutions, as well as rearrangements and combinations of the preceding embodiments, can be made by those skilled in the art, without departing from the novel spirit and scope of this invention.

What is claimed is:

1. A single ended pulse frequency modulation drive circuit for a piezoelectric device, comprising:
    a piezoelectric device having a resonate frequency and comprising a first input, a second input connected to ground, and an effective capacitance between the first input and the second input;
    an inductor having a first end and a second end, the inductor resonating with the effective capacitance of the piezoelectric device at the resonate frequency of the piezoelectric device, wherein the first end of the inductor is coupled to the first input of the piezoelectric device;
    a first switch coupled between ground and the first input of the piezoelectric device and operated by a periodic first signal at substantially a 50% duty factor of the resonate frequency of said piezoelectric device;
    an oscillator coupled to said piezoelectric device and operating at substantially the resonant frequency of the piezoelectric device for providing an output signal, said periodic first signal generated in response to said output signal; and
    a second switch coupled between the second end of the inductor and a DC power supply, said second switch closing and opening in response to a non-periodic second signal synchronized with the opening and closing action of said first switch, said second signal being generated in response to an asynchronous control signal such that the closing of said second switch gates an integral number of substantially half sinewave resonant waveforms having substantially zero switching volts across the input of the piezoelectric device.

2. The circuit of claim 1, wherein the integral number of substantially half sinewave resonant waveforms across the input of the piezoelectric device is evenly divisible by two.

3. The circuit of claim 1, further comprising a third switch, driven substantially 180° out-of-phase with the second switch, the third switch coupled between the second end of the inductor and ground.

4. The circuit of claim 1, wherein the oscillator is a phase-triggered oscillator having a feedback input.

5. The circuit of claim 1, wherein the piezoelectric device further comprises a feedback tap.

6. A differential pulse frequency modulation drive circuit for a piezoelectric device, comprising:
    a piezoelectric device having a resonant frequency and comprising a first input, a second input and an effective capacitance between the first input and the second input;
    a first inductor having a first end and a second end, the first inductor resonating with the effective capacitance of the piezoelectric device at the resonant frequency of the piezoelectric device, wherein the first end of the first inductor is coupled to the first input of the piezoelectric device;
    a second inductor having a first end and a second end, the second inductor resonating with the effective capacitance of the piezoelectric device at the resonant frequency of the piezoelectric device, wherein the first end of the second inductor is coupled to the second input of the piezoelectric device;
    a first switch coupled between ground and the first input of the piezoelectric device, said first switch being opened and closed by a periodic first signal at substantially a 50% duty factor of the resonant frequency of said piezoelectric device;
    a second switch coupled between the second end of the first inductor and a DC power supply, said second switch closing and opening in response to a non-periodic second signal synchronized with the opening and closing of said first switch;
    a third switch coupled between the second input of the piezoelectric device and ground, said third switch being opened and closed by a periodic third signal substantially 180° out-of-phase with said first switch and at substantially a 50% duty factor of the resonant frequency of said piezoelectric device;
    a fourth switch coupled between the second end of the second inductor and the DC power supply, said fourth switch closing and opening in response to a non-periodic fourth signal substantially 180° out-of-phase with said second switch and synchronized with the opening and closing of said third switch;
    an oscillator coupled to said piezoelectric device and operating at substantially the resonant frequency of the piezoelectric device for providing an output signal, said periodic first and third signals being generated in response to said output signal; and
    said non-periodic second and fourth signals being generated in response to an asynchronous control signal such that the closing of said second and fourth switches gates an integral number of substantially half sinewave resonant waveforms having substantially zero switching volts across the input of the piezoelectric device.

7. The circuit of claim 6, wherein the oscillator is a phase-triggered oscillator having a feedback input.

8. The circuit of claim 6, wherein the piezoelectric device further comprises a feedback tap.

9. The circuit of claim 6, wherein the given duty factor is determined by a single asynchronous square wave on/off signal.

10. A single ended pulse frequency modulation drive circuit for a piezoelectric transformer, comprising:
    a piezoelectric transformer having a resonant frequency and comprising a first input, a second input connected to ground, an effective capacitance between the first input and the second input, and an output section coupled to a load;
    an inductor having a first end and a second end, the inductor resonating with the effective capacitance of the piezoelectric transformer at the resonant frequency of the piezoelectric transformer, wherein the first end of the inductor is coupled to the first input of the piezoelectric transformer;
    a first switch coupled between ground and the first input of the piezoelectric transformer and operated by a periodic first signal at substantially a 50% duty factor of the resonant frequency of the piezoelectric transformer;
    an oscillator coupled to said piezoelectric transformer and operating at substantially the resonant frequency of the piezoelectric transformer for providing an output signal, said periodic first signal generated in response to said output signal; and a second switch coupled between the second end of the inductor and a DC power supply, said second switch closing and opening in response to a non-periodic second signal synchronized with the opening and closing action of said first switch, said second signal being generated in response to an asynchronous control signal such that the closing of said second switch gates an integral number of substantially half sinewave resonant waveforms having substantially zero switching volts across the input of the piezoelectric transformer.

11. The circuit of claim 10, wherein the integral number of substantially half sinewave resonant waveforms across the input of the piezoelectric transformer is evenly divisible by two.

12. The circuit of claim 10, further comprising a third switch, driven substantially 180° out-of-phase with the second switch, the third switch coupled between the second end of the inductor and ground.

13. The circuit of claim 10, wherein the oscillator is a phase-triggered oscillator having a feedback input.

14. The circuit of claim 10, wherein the piezoelectric transformer further comprises a feedback tap.

15. The circuit of claim 10, wherein the given duty factor is determined by a single asynchronous square wave on/off signal.

16. The circuit of claim 10, further comprising an output level sense coupled to the load.

17. The circuit of claim 10, wherein the output section of the piezoelectric transformer further comprises a second output section connected to the load.

18. A differential pulse frequency modulation drive circuit for a piezoelectric transformer, comprising:

a piezoelectric transformer having a resonant frequency and comprising a first input, a second input connected to ground and an effective capacitance between the first input and the second input and an output section coupled to a load;

a first inductor having a first end and a second end, the first inductor resonating with the effective capacitance of the piezoelectric transformer at the resonant frequency of the piezoelectric transformer, wherein the first end of the first inductor is coupled to the first input of the piezoelectric transformer;

a second inductor having a first end and a second end, the second inductor resonating with the effective capacitance of the piezoelectric transformer at the resonant frequency of the piezoelectric transformer, wherein the first end of the second inductor is coupled to the second input of the piezoelectric transformer;

a first switch coupled between ground and the first input of the piezoelectric transformer, said first switch being opened and closed by a periodic first signal at substantially a 50% duty factor of the resonant frequency of said piezoelectric transformer;

a second switch coupled between the second end of the first inductor and a DC power supply, said second switch closing and opening in response to a non-periodic second signal synchronous with the opening and closing of said first switch;

a third switch coupled between the second input of the piezoelectric transformer and ground, said third switch being opened and closed by a periodic third signal substantially 180° out-of-phase with said first switch and at substantially a 50% duty factor of the resonant frequency of said piezoelectric transformer;

a fourth switch coupled between the second end of the second inductor and the DC power supply, said fourth switch closing and opening in response to a non-periodic fourth signal substantially 180° out-of-phase with said second switch and synchronized with the opening and closing of said third switch;

an oscillator coupled to said piezoelectric transformer operating at substantially the resonant frequency of the piezoelectric transformer for providing an output signal, said periodic first and third signals being generated in response to said output signal; and said non-periodic second and fourth signals being generated in response to an asynchronous control signal such that the closing of said second and fourth switches gate an integral number of substantially half sinewave resonant waveforms having substantially zero switching volts across the input of the piezoelectric transformer.

19. The circuit of claim 18, wherein the oscillator is a phase-triggered oscillator having a feedback input.

20. The circuit of claim 18, wherein the piezoelectric transformer further comprises a feedback tap.

21. The circuit of claim 18, wherein the given duty factor is determined by a single asynchronous square wave on/off signal.

22. The circuit of claim 18, further comprising an output level sense coupled to the load.

23. The circuit of claim 18, wherein the output section of the piezoelectric transformer further comprises a second output section connected to the load.

24. The circuit of claim 18, further comprising a fifth switch, driven substantially 180° out-of-phase with the second switch, the fifth switch coupled between the second end of the first inductor and ground, and a sixth switch, driven substantially 180° out-of-phase with the fourth switch, the sixth switch coupled between the second end of the second inductor and ground.

25. The circuit of claim 18, coupled to a CCFL backlight.

26. The circuit of claim 18, coupled to a high voltage inverter.

27. The circuit of claim 1 and further comprising a signal gating circuit connected to receiving said oscillator output signal and said asynchronous control signal and for providing said periodic first signal and said non-periodic second signal.

28. The circuit of claim 6 and further comprising a signal gating circuit connected to received said oscillator output signal and said asynchronous control signal and for providing said periodic first and third signals and said non-periodic second and fourth signals.

29. The circuit of claim 10 and further comprising a signal gating circuit connected to receiving said oscillator output signal and said asynchronous control signal and for providing said periodic first signal and said non-periodic second signal.

30. The circuit of claim 18 and further comprising a signal gating circuit connected to received said oscillator output signal and said asynchronous control signal and for providing said periodic first and third signals and said non-periodic second and fourth signals.

* * * * *